United States Patent
Kang

(10) Patent No.: US 7,075,845 B2
(45) Date of Patent: Jul. 11, 2006

(54) FERAM AND SENSE AMPLIFIER ARRAY HAVING DATA BUS PULL-DOWN SENSING FUNCTION AND SENSING METHOD USING THE SAME

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 177 days.

(21) Appl. No.: 10/879,319

(22) Filed: Jun. 30, 2004

(65) Prior Publication Data

US 2005/0122813 A1 Jun. 9, 2005

(30) Foreign Application Priority Data

Dec. 4, 2003 (KR) ............... 10-2003-0087529

(51) Int. Cl.
*G11C 7/02* (2006.01)
(52) U.S. Cl. .............. 365/207; 365/205; 365/189.11; 365/189.05
(58) Field of Classification Search ........... 365/207, 365/205, 189.11, 189.05
See application file for complete search history.

(56) References Cited

U.S. PATENT DOCUMENTS

| 5,646,900 | A | * | 7/1997 | Tsukude et al. ............ 365/205 |
| 6,272,594 | B1 | | 8/2001 | Gupta et al. |
| 6,363,439 | B1 | | 3/2002 | Battles et al. |
| 6,462,998 | B1 | * | 10/2002 | Proebsting ................. 365/205 |
| 6,785,629 | B1 | * | 8/2004 | Rickes et al. .............. 365/145 |
| 2005/0146972 | A1 | * | 7/2005 | Hong ........................ 365/227 |

FOREIGN PATENT DOCUMENTS

KR 1998-14400 7/2000

* cited by examiner

*Primary Examiner*—Tuan T. Nguyen
(74) *Attorney, Agent, or Firm*—Heller Ehrman LLP

(57) ABSTRACT

A nonvolatile ferroelectric memory device features a data bus pull-down sensing function. The nonvolatile ferroelectric memory device having a data bus pull-down sensing function comprises a plurality of cell array blocks, a common data bus unit and a sense amplifier array unit. The sense amplifier array unit pulls down a voltage of the common data bus unit before read data are sensed to a predetermined level to improve transmission characteristics of cell data to a data bus. As a result, the data sensing speed is improved.

13 Claims, 20 Drawing Sheets

FERAM AND SENSE AMPLIFIER ARRAY HAVING DATA BUS PULL-DOWN SENSING FUNCTION AND SENSING METHOD USING THE SAME

BACKGROUND OF THE INVENTION

1. Field of the Invention

The present invention generally relates to a nonvolatile ferroelectric memory device having a hierarchical bit line architecture, and more specifically, to a nonvolatile ferroelectric memory device comprising a sense amplifier array for sensing cell data without using a reference voltage and pulling down a precharge voltage level of a data bus to a predetermined level before data are sensed to improve transmission characteristics of cell data, and a data sensing method using the same.

2. Description of the Prior Art

Generally, a ferroelectric random access memory (hereinafter, referred to as 'FeRAM') has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 1998-14400 by the same inventor of the present invention. Therefore, the basic structure and the operation on the FeRAM are not described herein.

As the chip operation voltage of the FeRAM becomes lower, the cell sensing voltage also decreases. As a result, it is difficult to embody the rapid operating speed in a FeRAM chip having a 1T1C (1-Transistor 1-Capacitor) structure. Specifically, when the sensing voltage of cell data is small, it is difficult to sense cell data due to the small voltage margin.

SUMMARY OF THE INVENTION

Accordingly, it is an object of the present invention to provide a nonvolatile ferroelectric memory device having an improved circuit configuration to improve transmission characteristics of cell data, thereby improving the sensing margin and the sensing speed of data.

In an embodiment, a sense amplifier array having a data bus pull-down sensing function is applied to a nonvolatile ferroelectric memory device comprising a cell array having a hierarchical bit line architecture for inducing a sensing voltage to a main bit line by converting a sensing voltage of a sub bit line to current. The sense amplifier array comprises a bus pull-up unit, a bus pull-down unit, a sense amplifier unit, a lock switch unit, a data latch unit, a data-out regulating unit and a write switch unit.

The bus pull-up unit pulls up the data bus in a precharge mode. The bus pull-down unit pulls down a voltage of the pulled-up data bus to a predetermined level before data are sensed. The sense amplifier unit senses a voltage of the data bus depending on a previously set sensing detection threshold voltage. The lock switch unit selectively transmits data sensed in the sense amplifier unit to the data latch in response to a lock signal. The data latch unit stores data transmitted through the lock switch unit. The data-out regulating unit transmits data stored in the data latch unit to a data buffer for external output. The write switch unit selectively transmits data of the data-out regulating unit to the data bus for data restoration.

In an embodiment, a nonvolatile ferroelectric memory device having a data bus pull-down sensing function comprises a plurality of cell array blocks, a common data bus and a sense amplifier array unit.

The plurality of cell array blocks each comprising a cell array having a hierarchical bit line architecture store cell data. The common data bus shared by the plurality of cell array blocks transmits read data and write data. The sense amplifier array unit connected to the common data bus senses the read data transmitted from the common data bus and transmits the write data to the common data bus. Specifically, the sense amplifier array unit previously pulls down a voltage of the common data bus to a predetermined level before the read data are sensed.

In an embodiment, a data sensing method using a data bus pull-down function in a memory device comprising a plurality of cell array blocks each comprising a cell array having a hierarchical bit line architecture for inducing a sensing voltage of a main bit line by converting a sensing voltage of a sub bit line to current and a common data bus shared by the cell array blocks comprises the steps of: pulling up the main bit line and the common data bus in a precharge mode; pulling down the pulled-up common data bus to a predetermined level before data are sensed; and inducing voltage change of the common data bus by a sensing voltage induced to the main bit line while the common data bus is pulled down to the predetermined level, and sensing a voltage of the common data bus by using a previously set sensing detection threshold voltage.

BRIEF DESCRIPTION OF THE DRAWINGS

Other aspects and advantages of the present invention will become apparent upon reading the following detailed description and upon reference to the drawings in which:

FIG. 9b is a diagram illustrating the waveform of the sensing operation of FIG. 9a;

FIG. 10b is a diagram illustrating the waveform of the sensing operation of FIG. 10a;

DETAILED DESCRIPTION OF THE PREFERRED EMBODIMENTS

The present invention will be described in detail with reference to the accompanying drawings.

Figure 1:
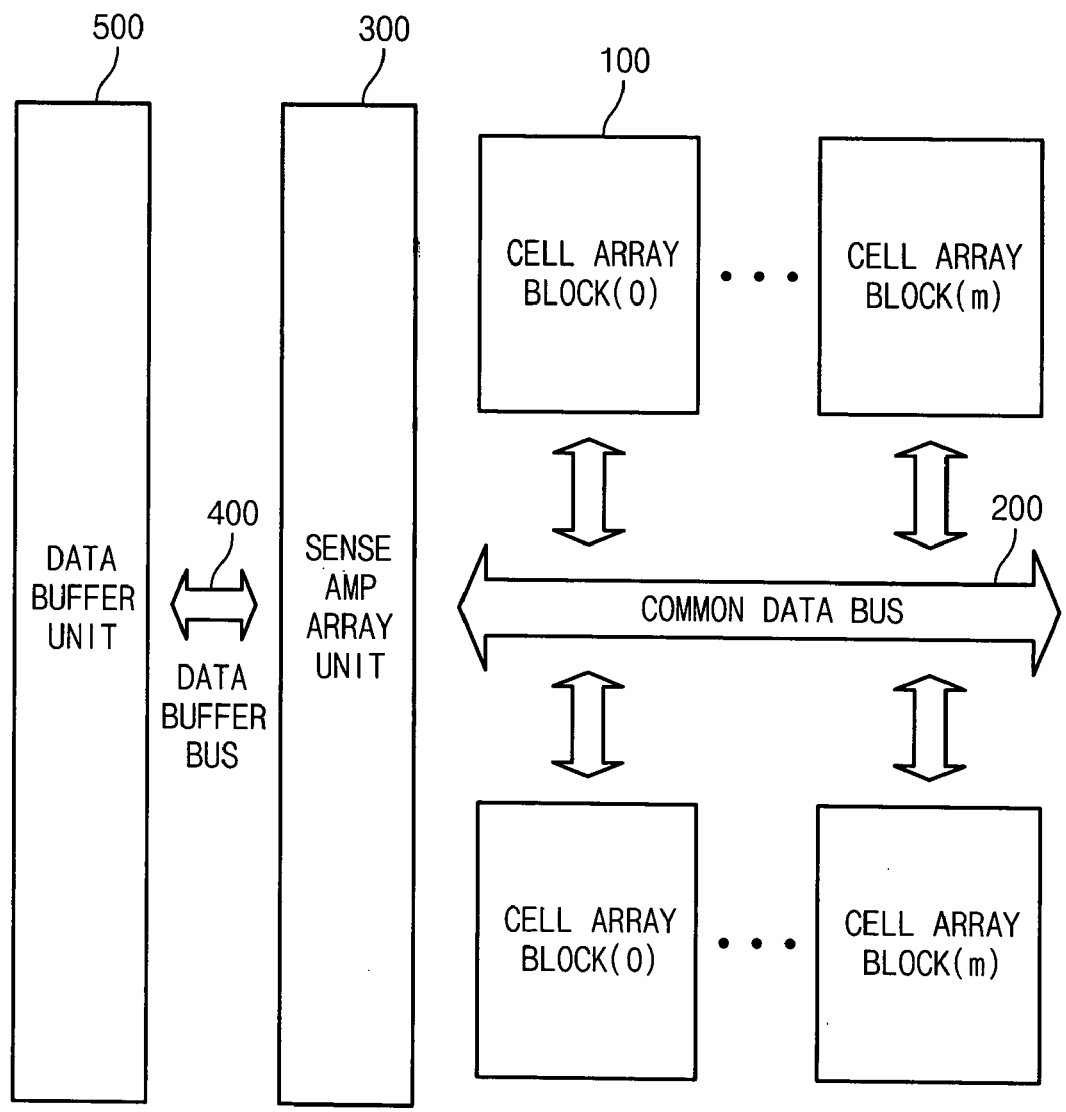
FIG. 1 is a block diagram of a nonvolatile ferroelectric memory device according to an embodiment of the present invention.

FIG. 1 is a block diagram of a nonvolatile ferroelectric memory device according to an embodiment of the present invention.

In an embodiment, the nonvolatile ferroelectric memory device comprises a plurality of cell array blocks 100, a common data bus 200, a sense amplifier array unit 300, a data buffer bus 400 and a data buffer unit 500.

Each of the cell array blocks 100 comprises a plurality of cell arrays for storing data. Specifically, the cell array block 100 has a hierarchical bit line architecture including a plurality of sub bit lines selectively connected to one of a plurality of main bit lines each connected to a plurality of unit cells (cell arrays). If data of a unit cell are applied to the sub bit line when a word line and a plate line are activated, the cell array block 100 converts a sensing voltage of the sub bit line into current and induces a sensing voltage of the main bit line. The plurality of cell array blocks 100 share the common data bus 200.

The sense amplifier array unit 300 connected to the cell array block 100 through the common data bus 200 senses cell data and outputs the sensed data to the data buffer bus 400. The sense amplifier array unit 300 outputs the sensed data to the common data bus 200 again for restoring the datain the cell array block 100. Here, the sense amplifier array unit 300 pulls down a voltage of the common data bus 200 which is precharged to a high level to a predetermined level before data is sensed for cell data sensing. The sense amplifier array unit 300 connected to the data buffer unit 500 through the data buffer bus 400 outputs write data from the data buffer unit 500 to the common data bus 200.

The data buffer unit 500 buffers externally inputted write data to be transmitted to the sense amplifier array unit 300 and read data received from the sense amplifier array unit 300 to be outputted externally. The data buffer unit 500 is connected through the data buffer bus 400 to the sense amplifier array unit 300.

In a read mode, the read data applied from the cell array block 100 to the common data bus 200 is sensed and stored in the sense amplifier array unit 300. The read data stored in the sense amplifier array unit 300 are outputted through the data buffer bus 400 to the data buffer unit 500, and transmitted through the common data bus 200 to the cell array block 100 and restored.

In a write mode, the write datainputted through the data buffer unit 500 are stored through the data buffer bus 400 in the sense amplifier array unit 300. The write data stored in the sense amplifier array unit 300 are transmitted through the common data bus 200 to the cell array block 100 and written.

Figure 2:
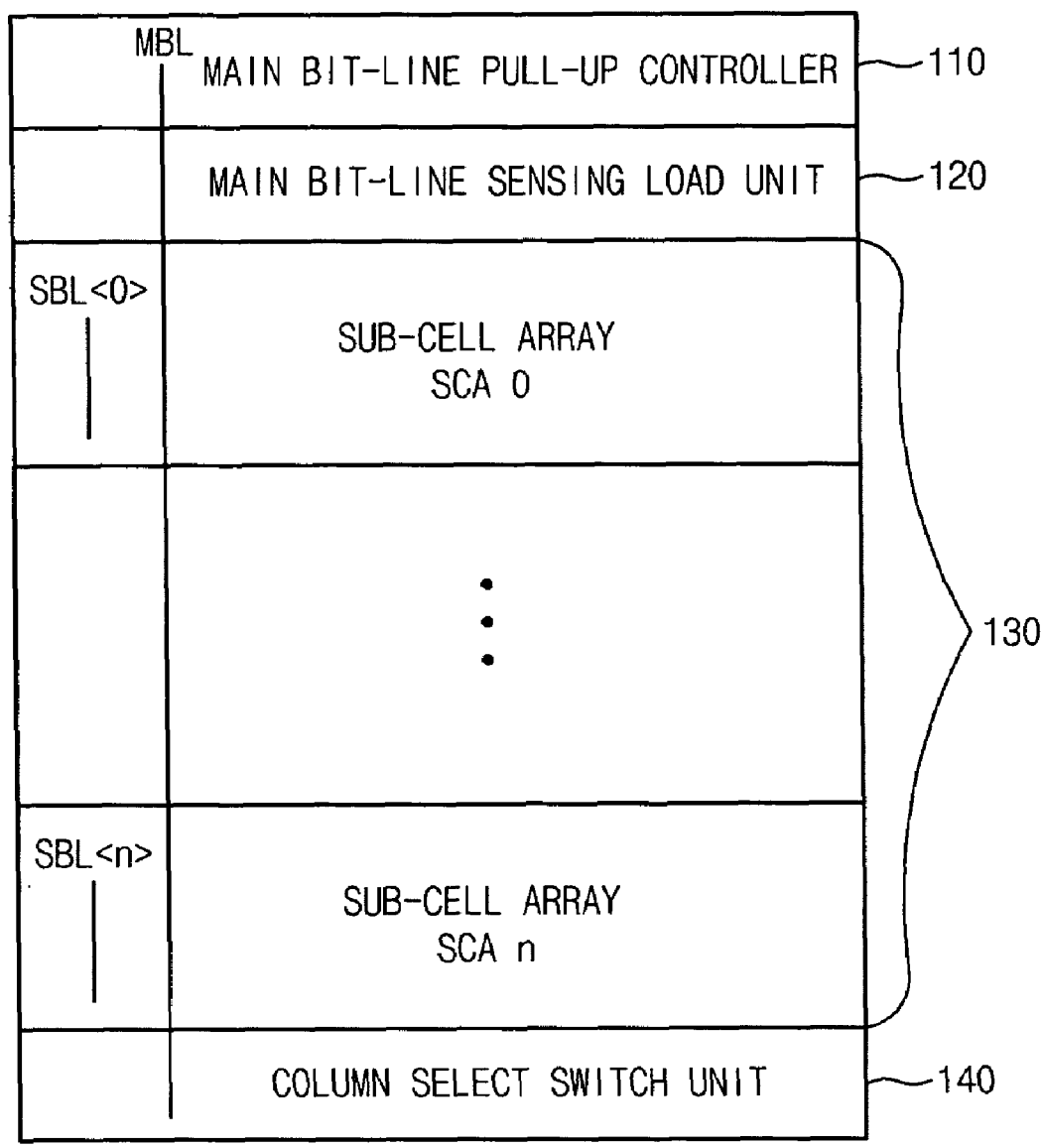
FIG. 2 is a diagram of a cell array block of FIG. 1.

FIG. 2 is a diagram of the cell array block 100 of FIG. 1.

The cell array block 100 comprises a main bit line pull-up control unit 110, a main bit line sensing load unit 120, a plurality of sub cell arrays 130 and a column selecting switch unit 140.

The main bit line MBL is shared by the plurality of sub cell arrays 130, and each of sub bit lines SBL<0>~SBL<n> is included in each sub cell array SCA0~SCAn. The main bit line MBL is selectively connected through the column selecting switch unit 140 to the common data bus unit 200.

Figure 3:
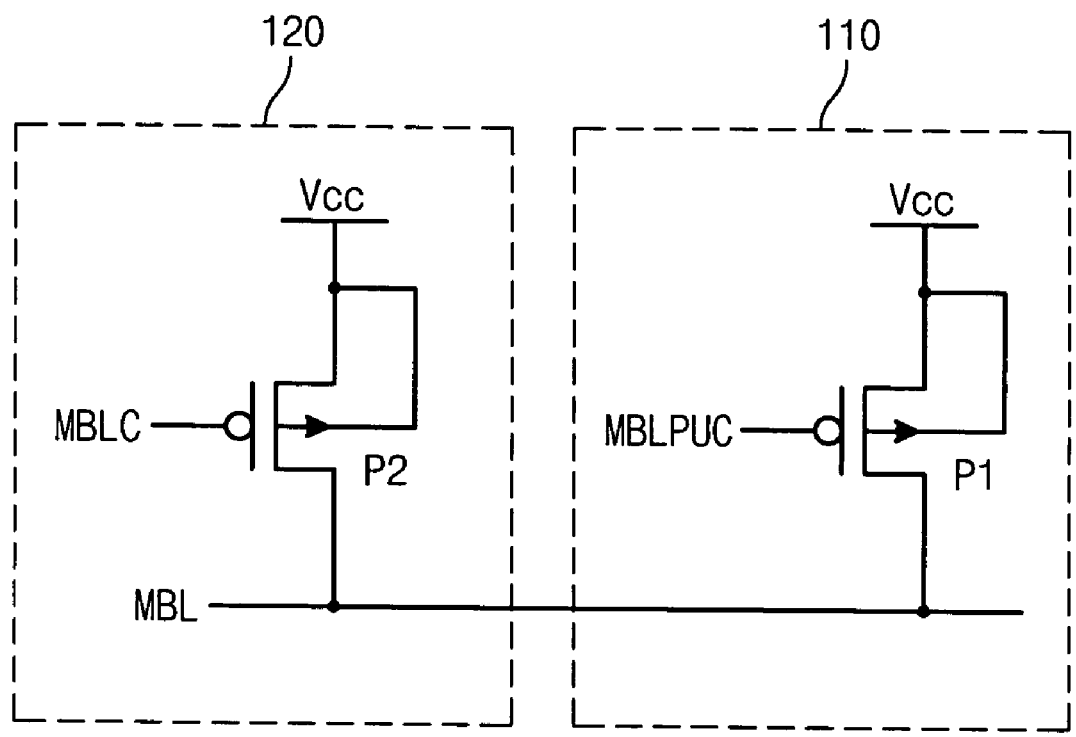
FIG. 3 is a circuit diagram of a main bit line pull-up control unit and a main bit line sensing load unit of FIG. 2.

FIG. 3 is a circuit diagram of the main bit line pull-up control unit 110 and the main bit line sensing load unit 120 of FIG. 2.

The main bit line pull-up control unit 110 comprises a PMOS transistor P1 for pulling up the main bit line MBL in response to a main bit line pull-up control signal MBLPUC in a precharge mode. The PMOS transistor P1 has a source connected to a power voltage terminal VCC, a drain connected to the main bit line MBL, and a gate to receive the main bit line pull-up control signal MBLPUC.

The main bit line sensing load unit 120 comprises a PMOS transistor P2 for controlling sensing load of the main bit line MBL. The PMOS transistor P2 has a source connected to the power voltage terminal VCC, a drain connected to the main bit line MBL, and a gate to receive a main bit line control signal MBLC.

Figure 4:
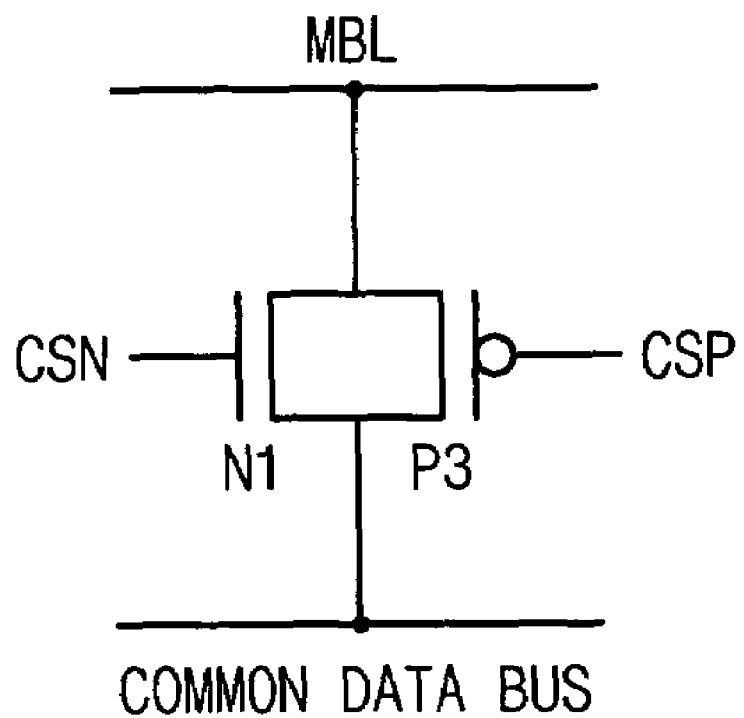
FIG. 4 is a circuit diagram of a column selecting switch unit of FIG. 2.

FIG. 4 is a circuit diagram of the column selecting switch unit 140 of FIG. 2.

The column selecting switch unit 140 selectively connects the common data bus unit 200 to the main bit line MBL in response to column selecting signals CSN and CSP. The column selecting switch unit 140 comprises a NMOS transistor and a PMOS transistor P3 which are connected between the main bit line MBL and the common data bus unit 200. The column selecting signal CSN is applied to a gate of the NMOS transistor N1, and the column selecting signal CSP is applied to a gate to the PMOS transistor P3.

Figure 5:
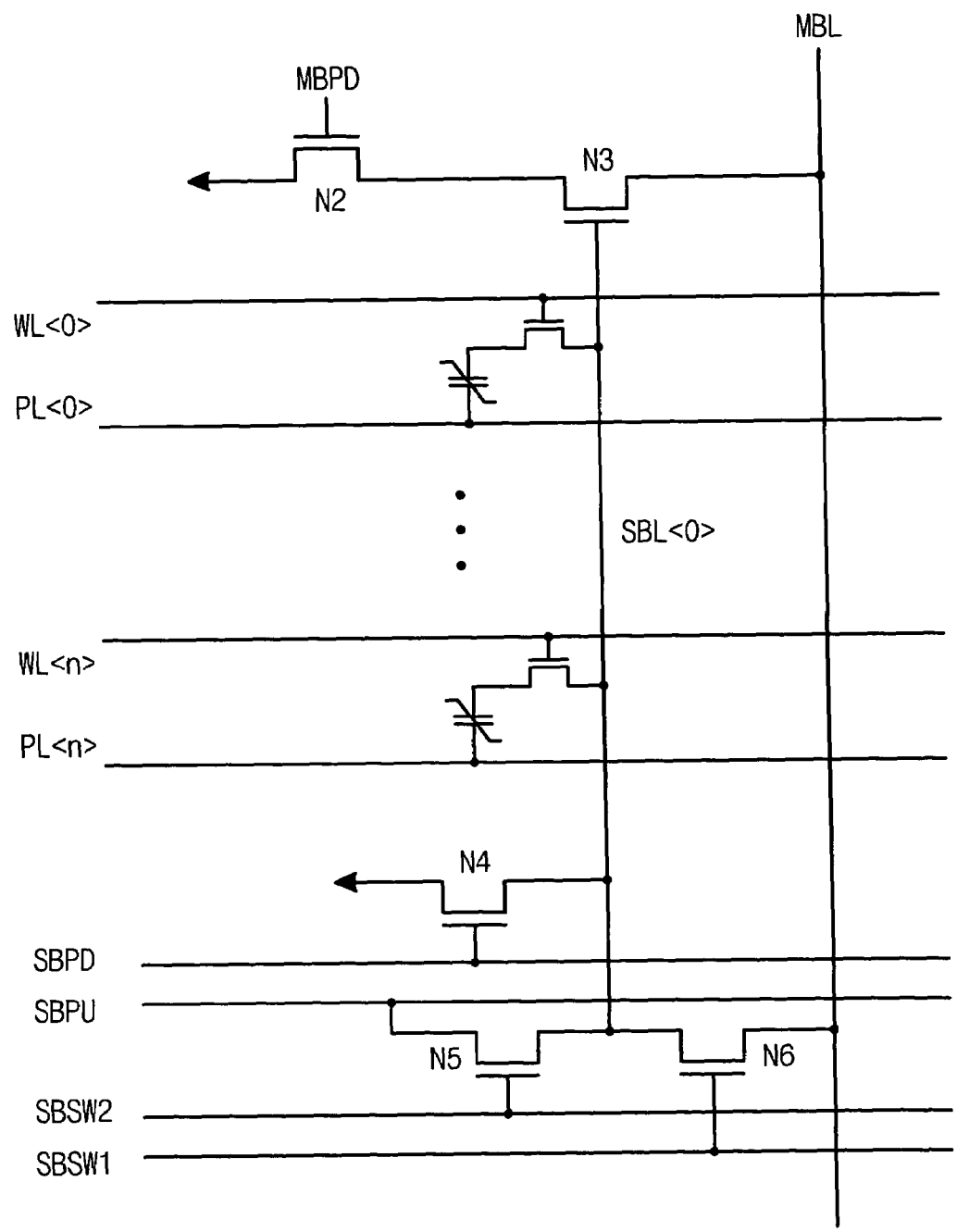
FIG. 5 is a circuit diagram of one unit sub cell array selected from sub cell arrays of FIG. 2.

FIG. 5 is a circuit diagram of one unit sub cell array SCA0 selected from sub cell arrays SCA0~SCAn of FIG. 2.

If a sub bit line selecting signal SBSW1 is activated, a NMOS transistor N6 is turned on. As a result, load of the main bit line MBL is adjusted to a level of one sub bit line SBL<0>. If a sub bit line pull-down signal SBPD is activated to turn on a NMOS transistor N4, the sub bit line SBL<0> is adjusted to a ground voltage level.

The sub bit line pull-up signal SBPU regulates power to be supplied to the sub bit line SBL<0>. A sub bit line selecting signal SBSW2 regulates signal flow between the sub bit line pull-up signal SBPU and the sub bit line SBL<0>.

To generate a high voltage in the sub bit line SBL<0>, a voltage higher than the power voltage VCC is to be supplied as the sub bit line pull-up signal SBPU. Next, if the sub bit line selecting signal SBSW2 is activated to turn on a NMOS transistor N5, a high voltage (SBPU) is supplied to the sub bit line SBL<0>.

A NMOS transistor N2, connected between a ground voltage and a NMOS transistor N3, has a gate to receive a main bit line pull-down signal MBPD. The NMOS transistor N3, connected between the NMOS transistor N2 and the main bit line MBL, has a gate connected to the sub bit line SBL<0>. When the main bit line pull-down signal MBPD is activated, the NMOS transistor N3 regulates the amount of current leaked from the main bit line MBL to a ground depending on the sensing voltage of the sub bit line SBL<0>. As a result, the sensing voltage of the main bit line MBL is determined depending on the amount of current leaked by the NMOS transistor n3.

For example, if a data value of the selected cell is 'high', a high voltage is transmitted to the sub bit line SBL<0>. As a result, the amount of current flowing through the NMOS transistor N3 becomes larger, thereby lowering the voltage level of the main bit line MBL<0> with a great width. On the other hand, if data of the selected cell is 'low', a low voltage is transmitted to the sub bit line SBL<0>. As a result, the amount of current flowing through the NMOS transistor N3 becomes smaller, thereby lowering the voltage level of the main bit line MBL<0> with a little width. In this way, a level difference of the sensing voltage of the main bit line MBL<0> is generated depending on cell data, and data of the selected cell can be sensed by using the level difference.

Figure 6:
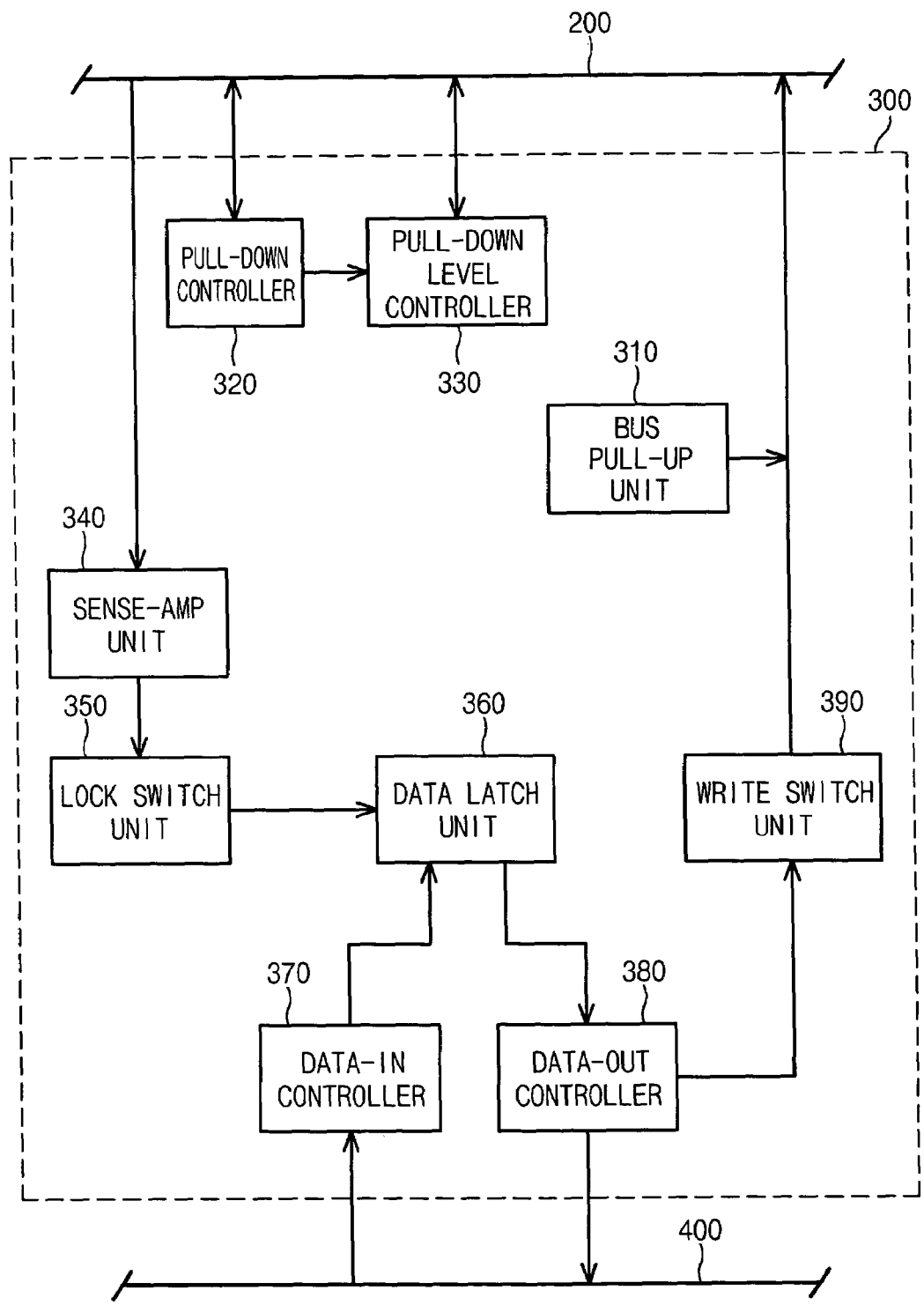
FIG. 6 is a diagram of a sense amplifier array unit of FIG. 1.
Figure 7:
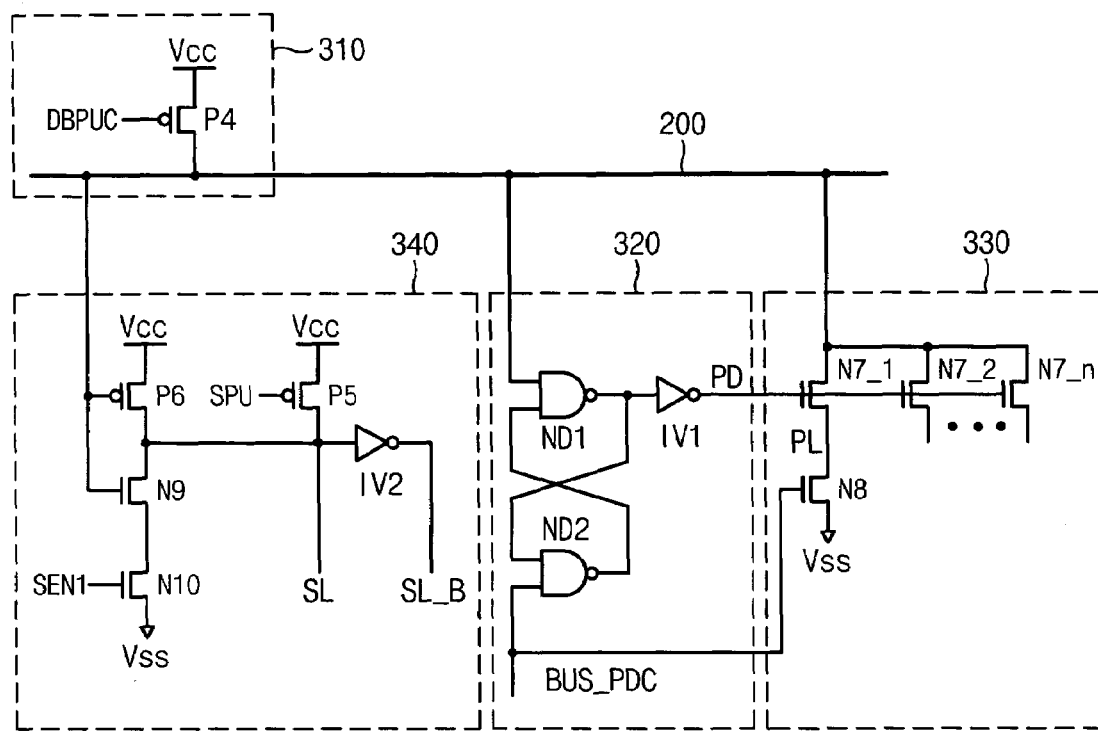
FIG. 7 is a circuit diagram illustrating circuits related to the data sensing operation in the sense amplifier array unit of FIG. 6.
Figure 8:
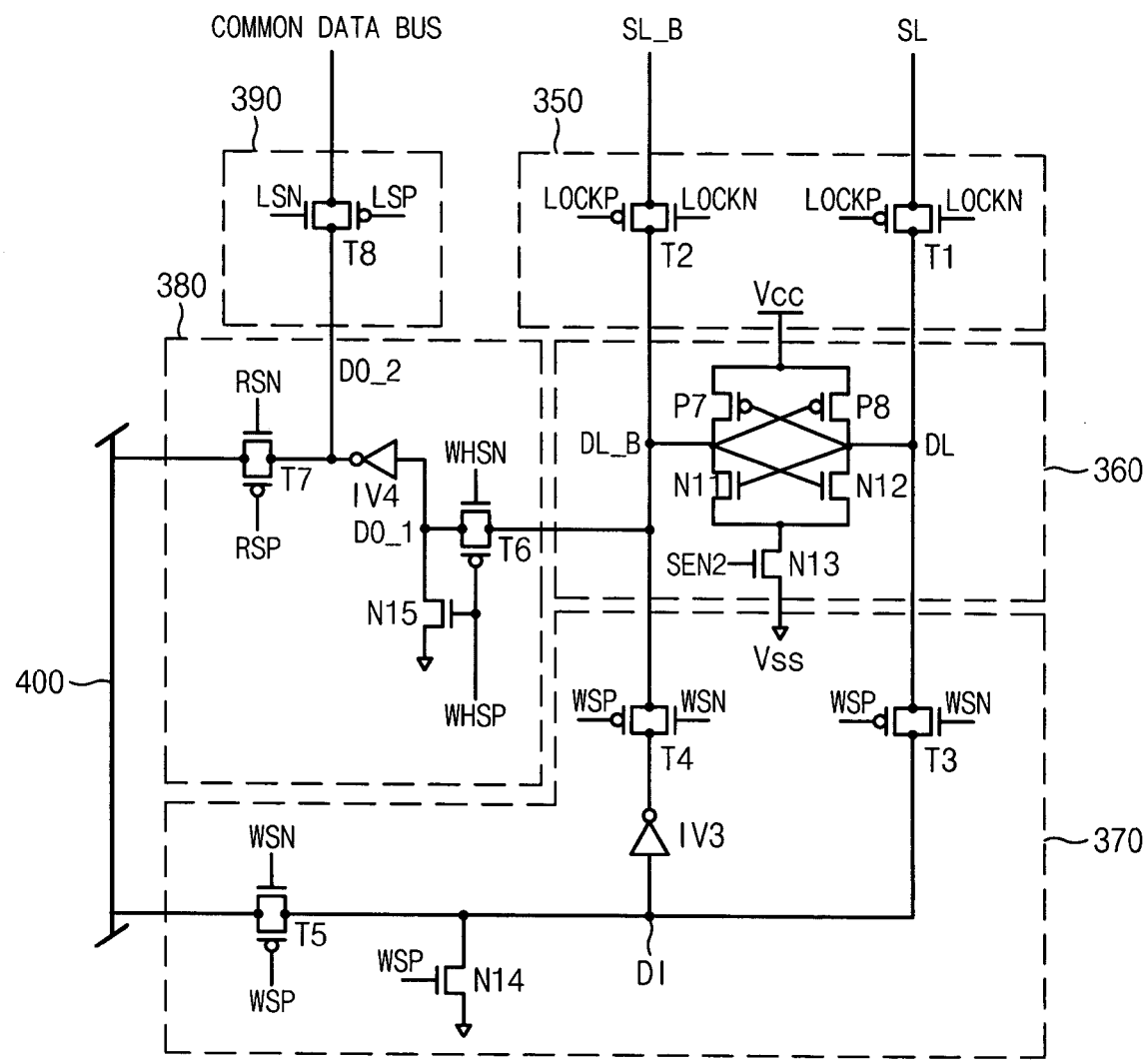
FIG. 8 is a circuit diagram illustrating circuits related to the data latch and input/output operations in the sense amplifier array unit of FIG. 6.

FIG. 6 is a diagram of the sense amplifier array unit 300 of FIG. 1; FIG. 7 is a circuit diagram illustrating circuits related to the data sensing operation in the sense amplifier array unit of FIG. 6; and FIG. 8 is a circuit diagram illustrating circuits related to the data latch and input/output operations in the sense amplifier array unit of FIG. 6.

In an embodiment, the sense amplifier array unit 300 comprises a bus pull-up unit 310, a pull-down regulating unit 320, a pull-down level regulating unit 330, a sense amplifier unit 340, a lock switch unit 350, a data latch unit 360, a data-in regulating unit 370, a data-out regulating unit 380 and a write switch unit 390.

The bus pull-up unit 310 pulls up the common data bus 200 to a high level during the precharge mode. The bus pull-up unit 310 comprises a PMOS transistor P4 connected between the power voltage terminal VCC and the common data bus 200. The PMOS transistor P4 has a gate to receive a data bus pull-up control signal DBPUC.

If a bus pull-down control signal BUS_PDC is activated, the pull-down regulating unit 320 activates a pull-down signal PD for pulling down a voltage of the common data bus 200, which is precharged to a high level by the bus pull-up unit 310, to a predetermined level which refers to a target voltage. The pull-down regulating unit 320 comprises NAND gate ND1 and ND2, and an inverter IV1. The NAND gate ND1 performs a NAND operation on output signals from the common data bus 200 and the NAND gate ND2. The NAND gate ND2 performs a NAND operation on an output signals from the NAND gate ND1 and the bus pull-down control signal BUS_PDC. The inverter IV1 inverts the output signal from the NAND gate ND1, and outputs the pull-down signal PD.

The pull-down level regulating unit 330 pulls down the voltage of the common data bus 200 to the target voltage level in response to the pull-down signal PD from the pull-down regulating unit 320. The pull-down level regulating unit 330 comprises NMOS transistors N7_1~N7_n and N8. The NMOS transistors N7_1~N7_n connected in parallel between the common data bus 200 and a node PL regulates time required until the voltage of the common data bus 200 is pulled down to the target voltage level in response to the pull-down signal PD. The NMOS transistor N8, connected between the node PL and a ground voltage VSS, activates the pull-down level regulating unit 330 when the bus pull-down control signal BUS_PDC is applied. That is, the voltage of the common data bus 200 is faster pulled down as the number of the NMOS transistors N7_1~N7_n connected in parallel becomes larger.

The sense amplifier unit 340 senses the read data applied to the common data bus 200 in response to a sensing control signal SEN1. The sense amplifier unit 320 comprises PMOS transistors P5 and P6, NMOS transistors N9 and N10, and an inverter IV2.

The PMOS transistor P5, connected between the power voltage terminal VCC and a node SL, has a gate to receive a control signal SPU, and pulls up the node SL to a high level in the precharge mode. The PMOS transistor P6, connected between the power voltage terminal VCC and the node SL, has a gate connected to the common data bus 200. The NMOS transistors N9 and N10 are connected serially between the node SL and the ground voltage terminal. A gate of the NMOS transistor N9 is connected to the common data bus 200, and a gate of the NMOS transistor N10 receives the sensing control signal SEN1. The inverter IV2, connected between nodes SL and SL_B, inverts a signal of the node SL and outputs the inverted signal to the node SL_B. In an active period, the control signal SPU and the sensing control signal SEN1 become at a high level. As described above, the sense amplifier unit 340 compares the voltage of the common data bus 200 with a logic threshold voltage Vt of the CMOS transistor P6 and N9 and senses cell data. As a result, an reference voltage is not required for data sensing in an embodiment of the present invention.

The lock switch unit 350 controls transmission of two output signals from the sense amplifier unit 340 to the data latch unit 360. The lock switch unit 350 comprises transmission gates T1 and T2 which are turned on/off in response to lock signals LOCKN/LOCKP. The transmission gate T1 transmits data of the output node SL to the data latch unit 360, and the transmission gate T2 transmits data of the output node SL_B to the data latch unit 360. If the data sensed in the sense amplifier unit 340 are stored in the data latch unit 360, the lock switch unit 350 disconnects the data latch unit 360 from the output nodes SL and SL_B in response to the lock signals LOCKN/LOCKP.

The data latch unit 360 is activated in response to a control signal SEN2, and stores the read/write data. The data latch unit 360 comprises cross-coupled PMOS transistors P7 and P8, cross-coupled NMOS transistors N11 and N12, and a NMOS transistor N13 for activating a latch circuit when the control signal SEN2 is activated.

In the write mode, the data-in regulating unit 370 transmits the write data inputted through the data buffer bus 400 to the data latch unit 360. Here, a transmission gate T5 transmits data of the data buffer bus 400 to a node DI in response to write control signals WSN and WSP. A NMOS transistor N14, connected between the node DI and the ground voltage terminal, pulls down the node DI in response to the write control signal WSP. A transmission gate T3 transmits data of the node DI to a node DL in response to the write control signals WSN and WSP. A transmission gate T4 transmits data of the node DI inverted by an inverter IV3 to a node DL_B in response to the write control signal WSN and WSP.

The data-out regulating unit 380 transmits data stored in the data latch unit 360 to the data buffer bus 400 and/or the write switch unit 390 depending on the operating modes (read/write modes). Here, a transmission gate T6 transmits data of the node DL_B to a node DO_1 in response to control signals WHSN and WHSP. A transmission gate T7 transmits data of the node DO_1 inverted by an inverter IV4 to the data buffer bus 400 in response to the read control signal RSN and RSP. A NMOS transistor N15 pulls down the node DO_1 in response to the control signal WHSP. The data-out regulating unit 380 transmits the read data to the data buffer bus 400 and the write switch unit 390 in the read mode, and turns off a transmission gate T7 and transmits the write data to the write switch unit 390 in the write mode.

The write switch unit 390 transmits data of the data-out regulating unit 380 to the common data bus 200 in response to control signals LSN and LSP. The write switch unit 390 comprises a transmission gate T8 connected between a node DO_2 and the common data bus 200. The transmission gate T8 is turned on/off in response to the control signals LSN and LSP.

Figure 9A:
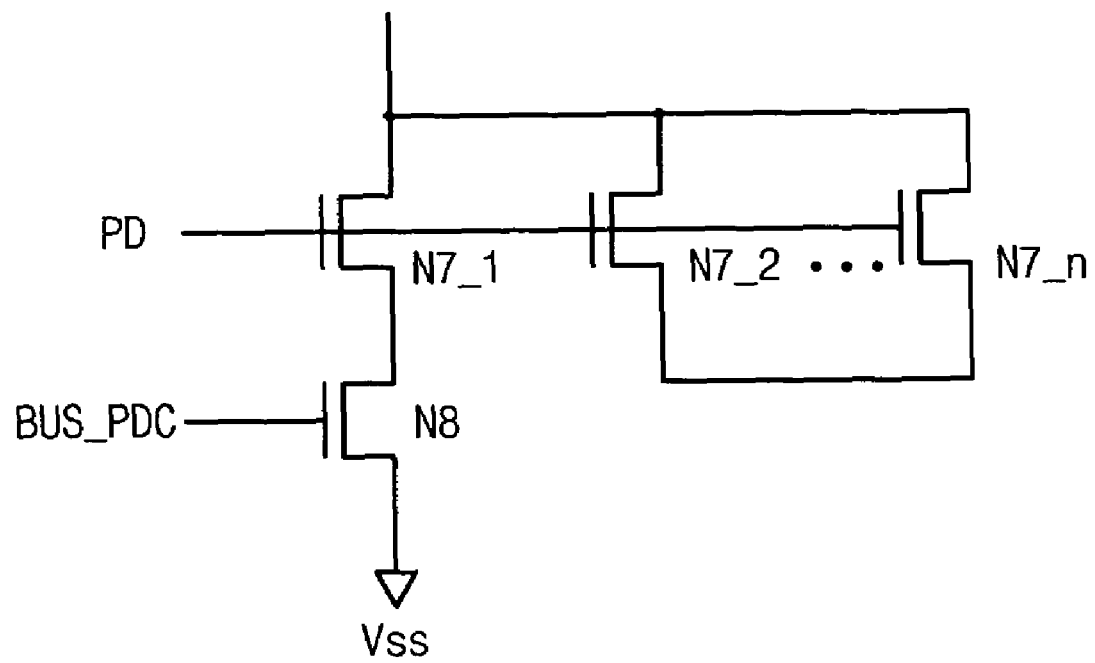
FIG. 9a is a diagram illustrating a first example of a pull-down level regulating unit of FIG. 7.
Figure 9B:
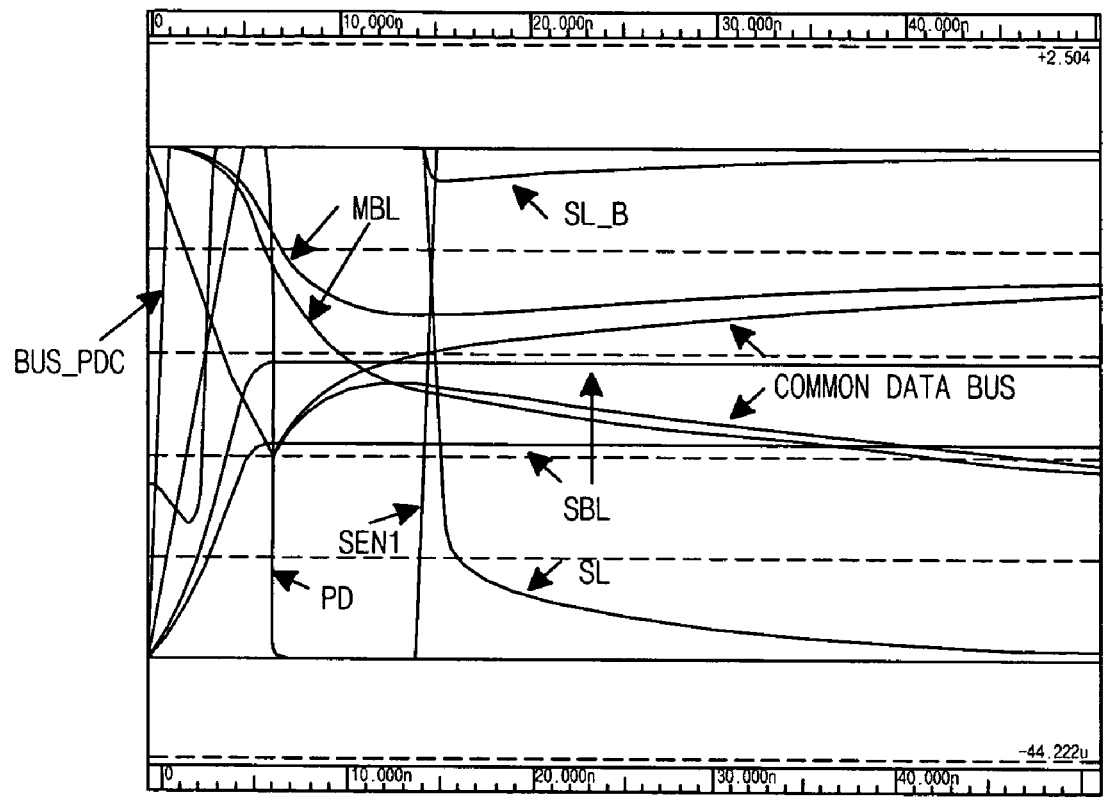
Figure 10A:
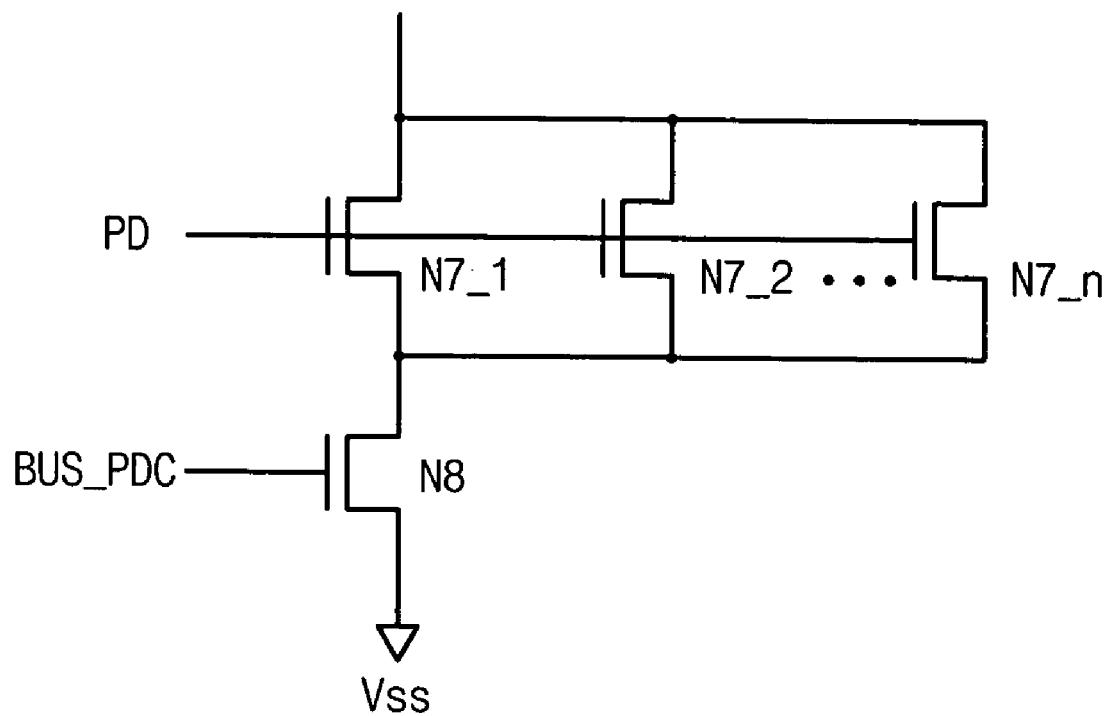
FIG. 10a is a diagram illustrating a second example of the pull-down level regulating unit of FIG. 7.

FIG. 9a is a diagram illustrating a first example of the pull-down level regulating unit 330 of FIG. 7; and FIG. 10a is a diagram illustrating a second example of the pull-down level regulating unit 330 of FIG. 7. FIG. 9b is a diagram illustrating the waveform of the sensing operation of FIG. 9a; and FIG. 10b is a diagram illustrating the waveform of the sensing operation of FIG. 10a.

Only the NMOS transistor N7_1 is connected serially to the NMOS transistor N8 in FIG. 9a, and a plurality of NMOS transistors N7_1~N7_n connected in parallel are connected serially to the NMOS transistor N8 in FIG. 10a.

If the voltage of the common data bus 200 is precharged to a high level and the bus pull-down control signal BUS_PDC is activated, the pull-down regulating unit 320 is activated. As a result, the pull-down signal PD is activated, the pull-down level regulating unit 330 is activated to pull down the voltage of the common data bus 200. If the voltage of the common data bus 200 is pulled down to the target voltage level, an input terminal of the NAND gate ND1 connected to the common data bus 200 becomes 'low' and the pull-down signal PD transits to 'low'. As a result, the pull-down operation of the common data bus 200 is stopped by the pull-down level regulating unit 330. After the voltage of the common data bus 200 is set to the target voltage level, the voltage of the common data bus 200 is differentiated depending on the voltage of the main bit line.

Figure 10B:
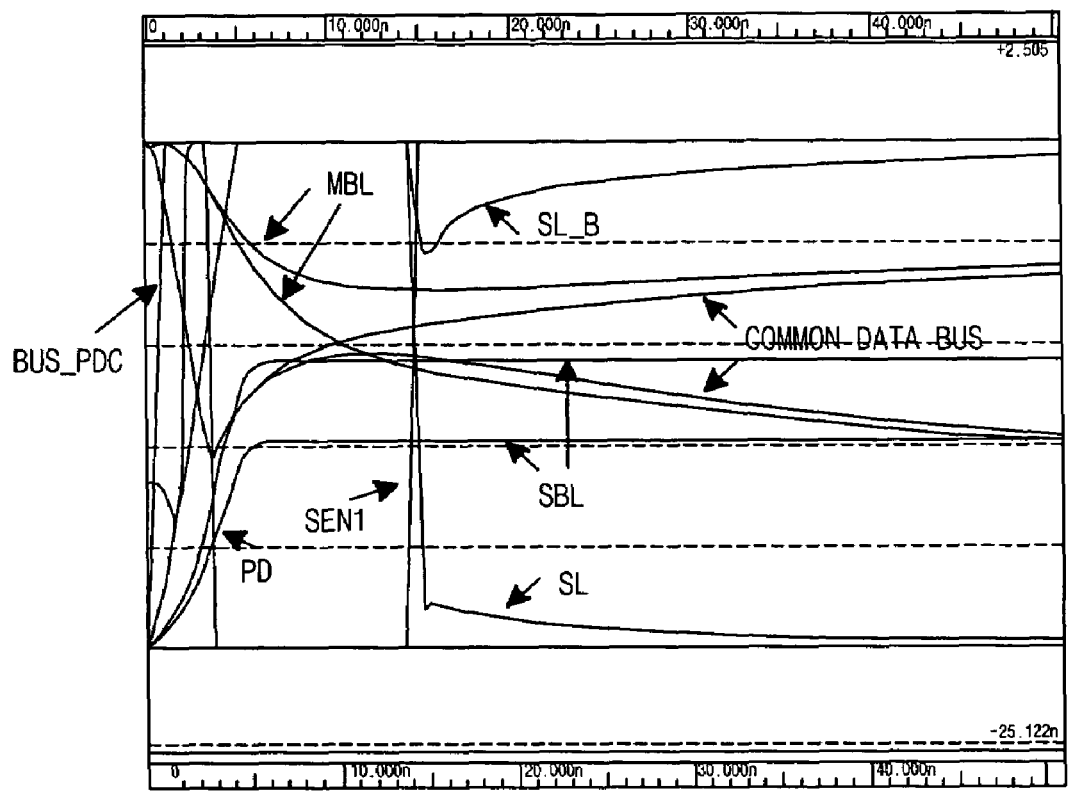

As shown in FIGS. 9b and 10b, the time required until the voltage of the common data bus 200 transits from the high level to the target voltage level can be regulated depending on the number of the NMOS transistors N7_1~N7_n connected to the NMOS transistor N8.

Figure 11:
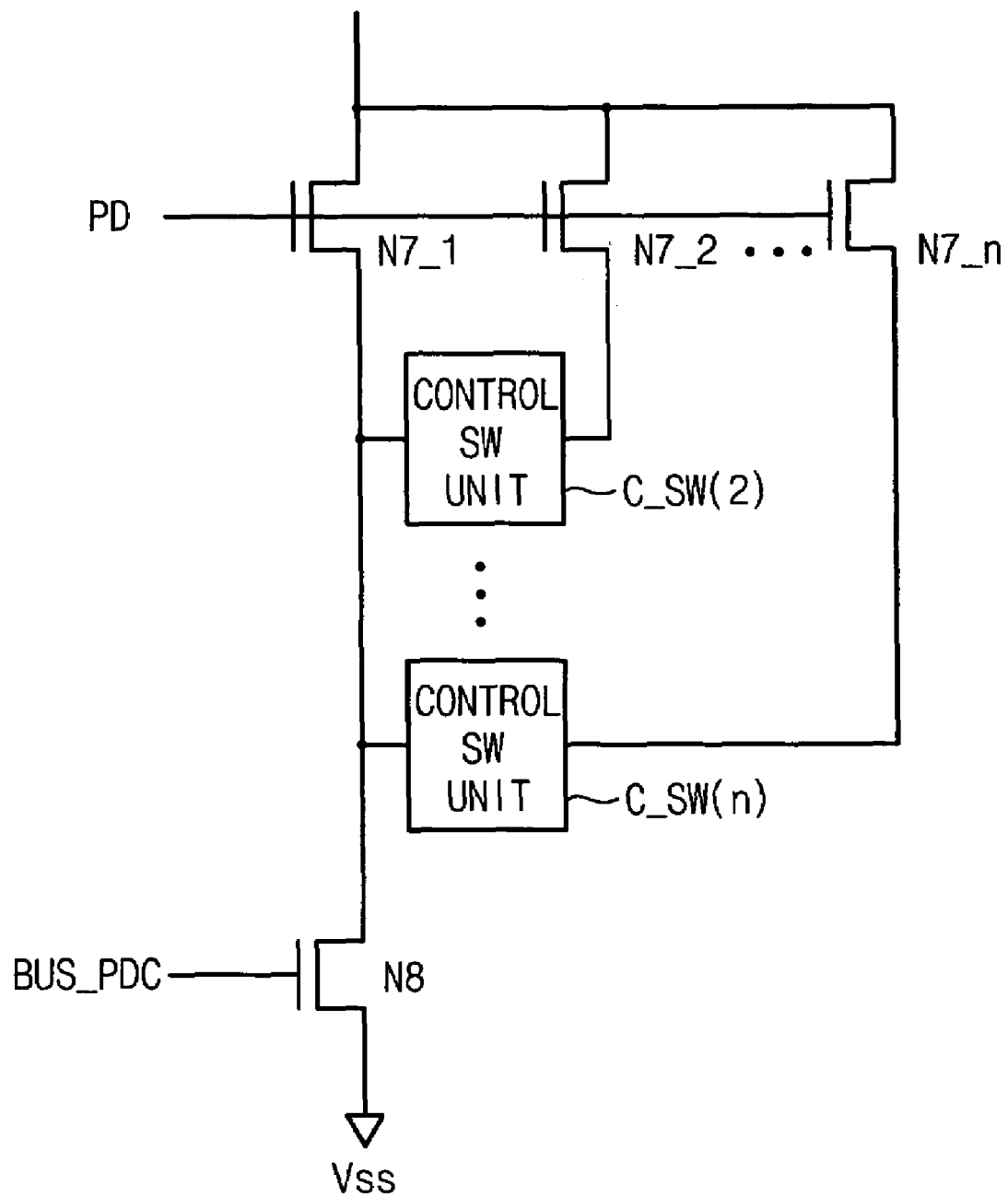
FIG. 11 is a diagram illustrating a third example of the pull-down level regulating unit of FIG. 7.

FIG. 11 is a diagram illustrating a third example of the pull-down level regulating unit 330 of FIG. 7.

In the third example, a plurality of regulating switch units C_SW(2)~C_SW(n) are respectively positioned between an output terminal of the NMOS transistor N7_1 and output terminals of the NMOS transistors N7_2~N7_n. Each of the regulating switch units C_SW(2)~C_SW(n) programmably connects the output terminals of the NMOS transistors N7_2~N7_n to the output terminal of the NMOS transistor N7_1. As a result, the number of the NMOS transistors N7_1~N7_n connected in parallel is programmably regulated.

Figure 12:
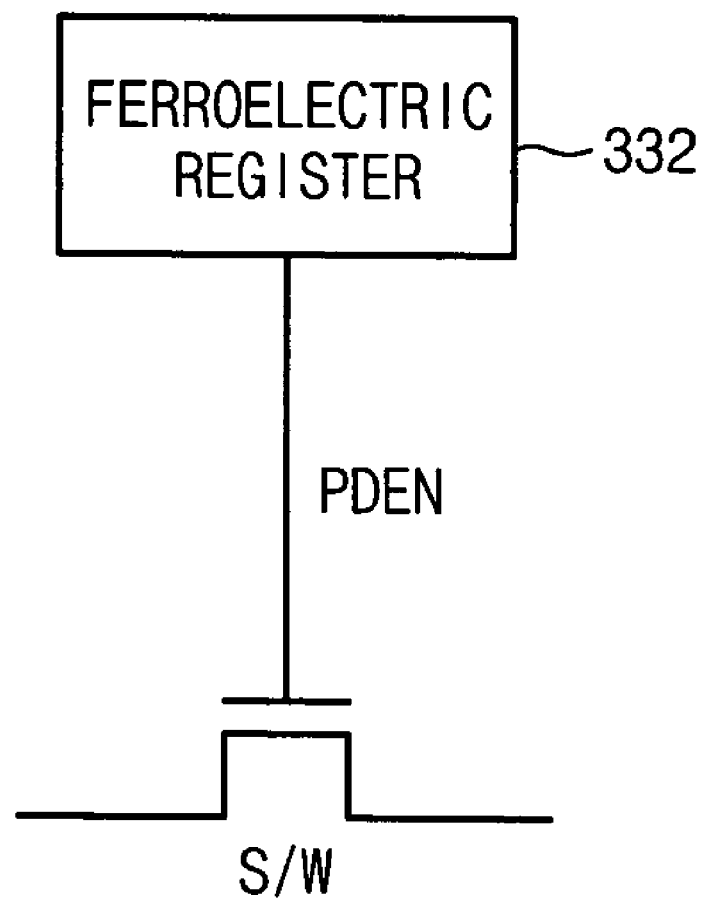
FIG. 12 is a diagram illustrating each regulating switch unit of FIG. 11.

FIG. 12 is a diagram illustrating each regulating switch unit of FIG. 11.

Each of the regulating switch units C_SW(2)~C_SW(n) comprises a switch unit S/W and a ferroelectric register unit 332. The switch unit S/W is turned on/off in response to a pull-down enable signal PDEN, and selectively connects the output terminals of the NMOS transistors N7_2~N7_n to the output terminal of the NMOS transistor N7_1. The ferroelectric register unit 332 outputs the pull-down enable signal PDEN programmably.

Figure 13:
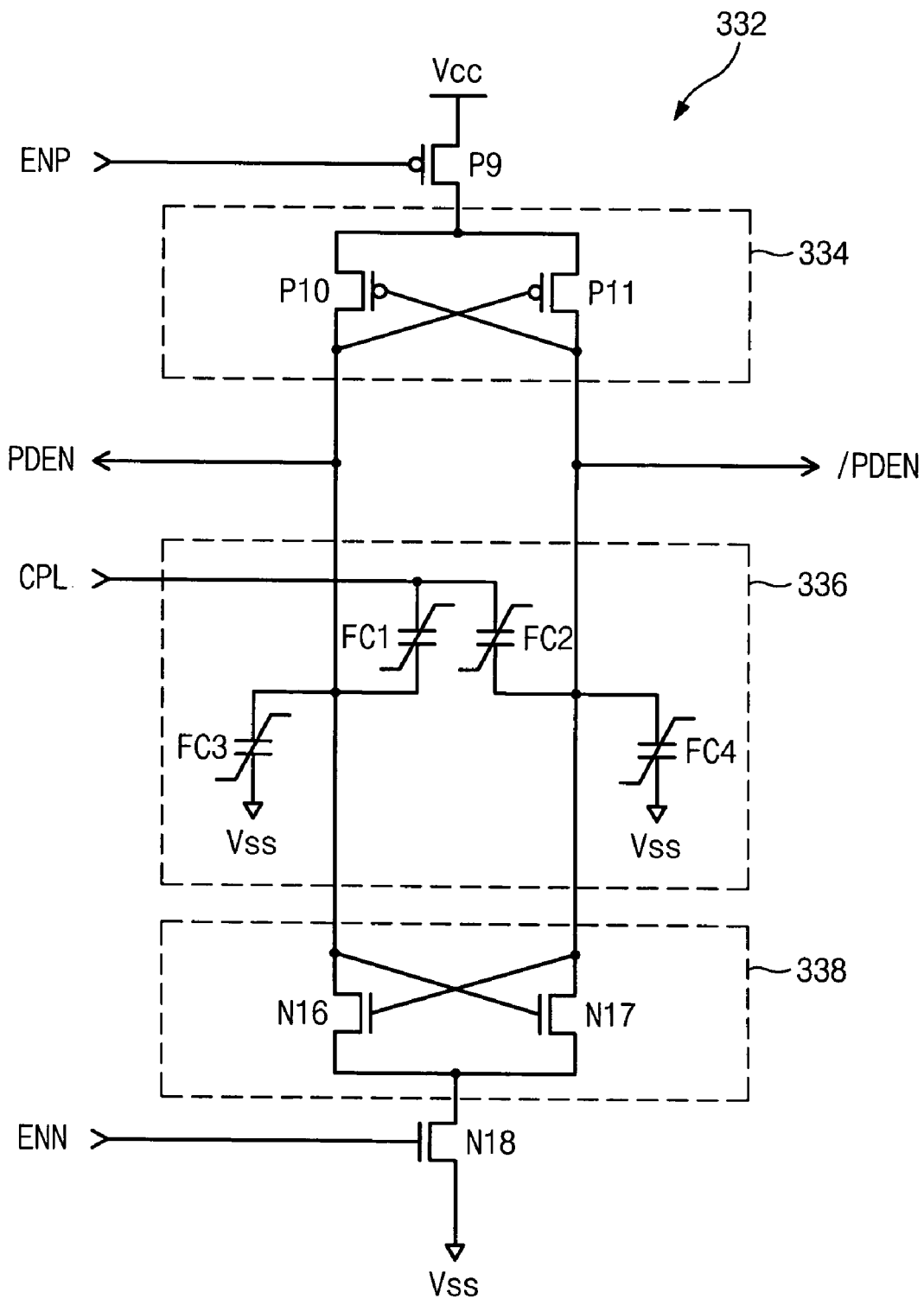
FIG. 13 is a circuit diagram of a ferroelectric register unit of FIG. 12.

FIG. 13 is a circuit diagram of the ferroelectric register unit of FIG. 12.

The ferroelectric register unit comprises a pull-up switch P9, a pull-up driving unit 334, a ferroelectric capacitor unit 336, a pull-down driving unit 338 and a pull-down switch N18.

The pull-up switch P9 applies a power voltage VCC to the pull-up driving unit 334 when a pull-up enable signal ENP is activated. The pull-up switch P9 comprises a PMOS transistor connected between the power voltage VCC and the pull-up driving unit 334. The PMOS transistor has a gate to receive the pull-up enable signal ENP.

The pull-up driving unit 334 drives the power voltage VCC applied from the pull-up switch P9. The pull-up driving unit 334 comprises PMOS transistors P10 and P11 which are located between the pull-up switch P9 and the ferroelectric capacitor unit 336 and cross-coupled between both output terminals.

The ferroelectric capacitor unit 336 generates a voltage difference in both output terminals in response to a cell plate signal CPL, and stores data.

The pull-down driving unit 338, which comprises NMOS transistors N16 and N17 cross-coupled between both output terminals, drives the ground voltage applied from the pull-down switch N18. The NMOS transistors N16 and N17 are connected between the ferroelectric capacitor unit 336 and the pull-down switch N18, and cross-coupled between both output terminals.

The pull-down switch N18 applies the ground voltage VSS to the pull-down driving unit 338 when a pull-down enable signal ENN is activated. The pull-down switch N18 comprises a NMOS transistor connected between the pull-down driving unit 338 and the ground voltage VSS. The NMOS transistor has a gate to receive the pull-down enable signal ENN.

The cell plate signal is transited to 'high' by a power-up detection pulse if the power voltage reaches a stable level. Charges stored in ferroelectric capacitors FC1 and FC2 generate a voltage difference in both output terminals by capacitance load of ferroelectric capacitors FC3 and FC4 when the cell plate signal CPL is 'high'. If a sufficient voltage difference is generated in both output terminals of the register, the pull-up enable signal ENP is activated to 'low' and the pull-down enable signal ENN is activated to 'high', thereby amplifying data of both output terminals. After data are amplified, the cell plate signal CPL is re-transited to 'low', destroyed high data of the ferroelectric capacitor FC1 or FC2 is restored.

Figure 14:
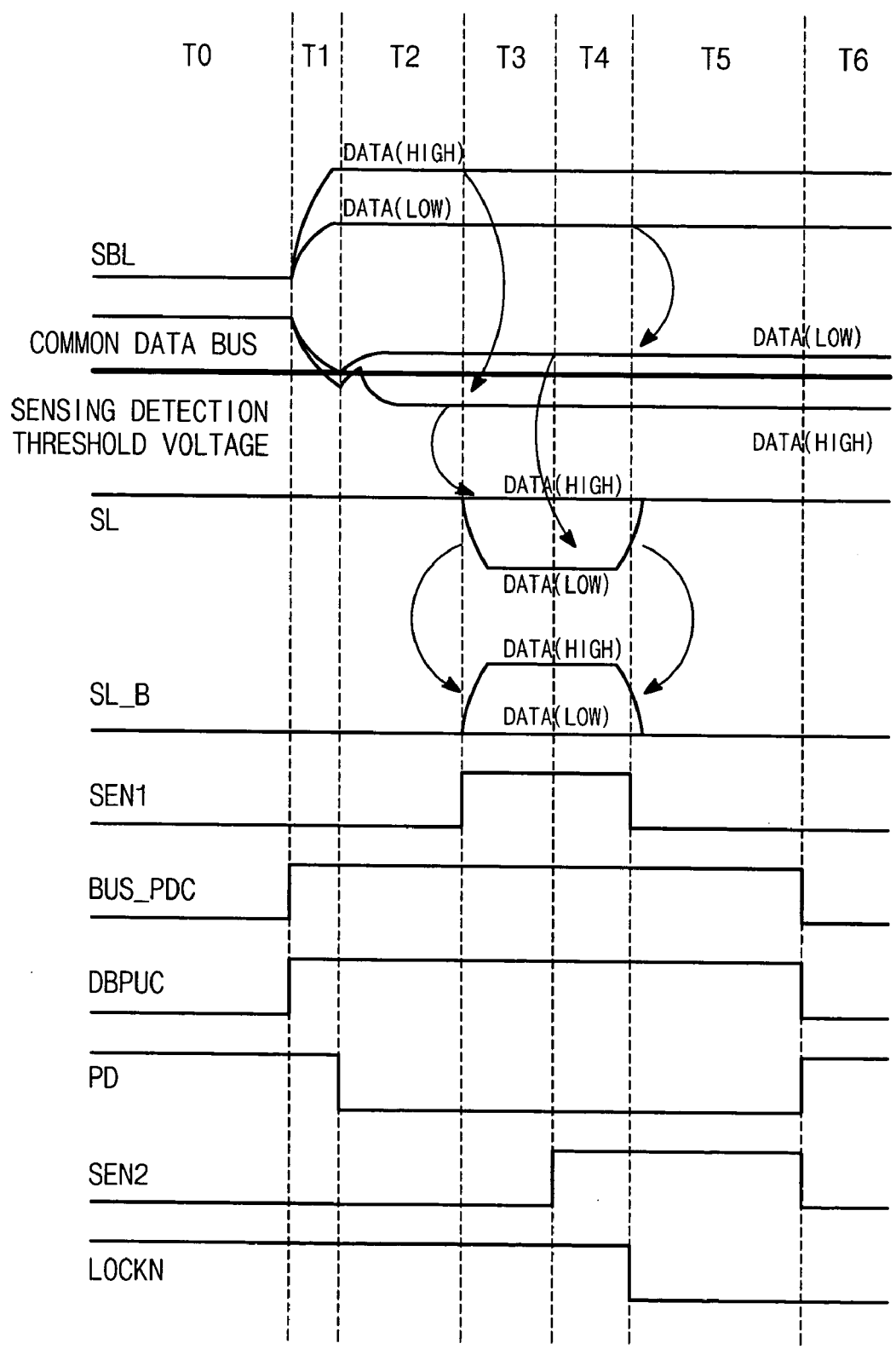
FIG. 14 is a timing diagram illustrating the data detection operation in a sense amplifier array unit according to an embodiment of the present invention.

FIG. 14 is a timing diagram illustrating the data detection operation in the sense amplifier array unit 300 according to an embodiment of the present invention.

In an interval T0, a word line WL and a plate line PL are inactivated, and the main bit line MBL and the common data bus 200 are precharged to 'high'. Here, the sub bit line SBL is precharged to 'low', and the node SL is precharged to 'high' by the control signal SPU. The control signals SEN1 and SEN2, and the bus pull-down control signal BSU_PDC is disabled. The pull-down signal PD and the lock signal LOCKN are enabled to 'high'.

In an interval T1, if cell data are read, the sensing voltage level of the sub bit line SBL is determined depending on a value of the corresponding cell data. Then, the main bit line MBL and the voltage of the common data bus 200 which are precharged to the high level are pulled down depending on the sensing voltage of the sub bit line SBL. Before the interval T1 starts, the data bus pull-up control signal DBPUC and the bus pull-down control signal DBPUC are enabled to 'high'. As a result, the common data bus 200 stops being pulled up by the bus pull-up unit 310, and starts being pulled down by the pull-down level regulating unit 330. Here, the pull-down time T1 of the common data bus 200 is determined depending on the number of the NMOS transistors N7_2~N7_n connected in parallel in the pull-down level regulating unit 330 as shown in FIGS. 9 and 10.

If the voltage of the common data bus 200 is pulled down to the target voltage level after the time T1 passes by, the output signal from the NAND gate ND1 is transited from 'low' to 'high' and the pull-down signal PD is disabled.

In an interval T2, since the amount of current flowing through the NMOS transistor N3 is differentiated depending on the sensing voltage of the sub bit line SBL, the change ratios of the main bit line MBL and the main data bus 200 depending on the cell data. Here, since the voltage of the common data bus 200 is previously pulled down to the target voltage level which is the sensing detection threshold voltage in the interval T1, the voltage of the common data bus 200 is faster transited to 'low' or 'high' in the interval T2 than in a conventional data bus when the voltage of the main bit line MBL is applied to the common data bus 200. That is, the time until the voltage of the common data bus 200 is reduced from the high level to the sensing detection threshold voltage level has been required after the data sensing operation starts in the conventional art. However, since the voltage of the common data bus 200 is compulsorily pulled down to the sensing threshold voltage level before the sensing operation, the voltage of the common data bus 200 is immediately changed higher or lower than the sensing threshold voltage when the voltage of the main bit line MBL is transmitted to the common data bus 200.

If the voltage of the common data bus 200 is changed to a level where data can be sensed, the control signal SEN1 is activated when an interval T3 starts so that the sensing voltage of the common data bus 200 is sensed in the sense amplifier unit 340. That is, in the interval T3, the sensing voltage of the common data bus 200 is stably changed higher or lower than the sensing threshold voltage. As a result, the CMOS transistor P6 and N9 of the sense amplifier unit 340 is selectively turned on, and data of the node SL becomes 'high' and data of the node SL_B becomes 'low'. The data of the node SL and SL_B are latched in the latch unit 360 as the control signal SEN2 is activated in an interval T4. If the data are latched in the latch unit 360, the lock signal LOCKN is inactivated in an interval T5 so that the lock switch unit 350 intercepts the application of the output signal of the sense amplifier unit 340 to the latch unit 360. The latched data are transmitted through the data-out regulating unit 380 to the data buffer bus 400 and the write switch unit 390.

Figure 15:
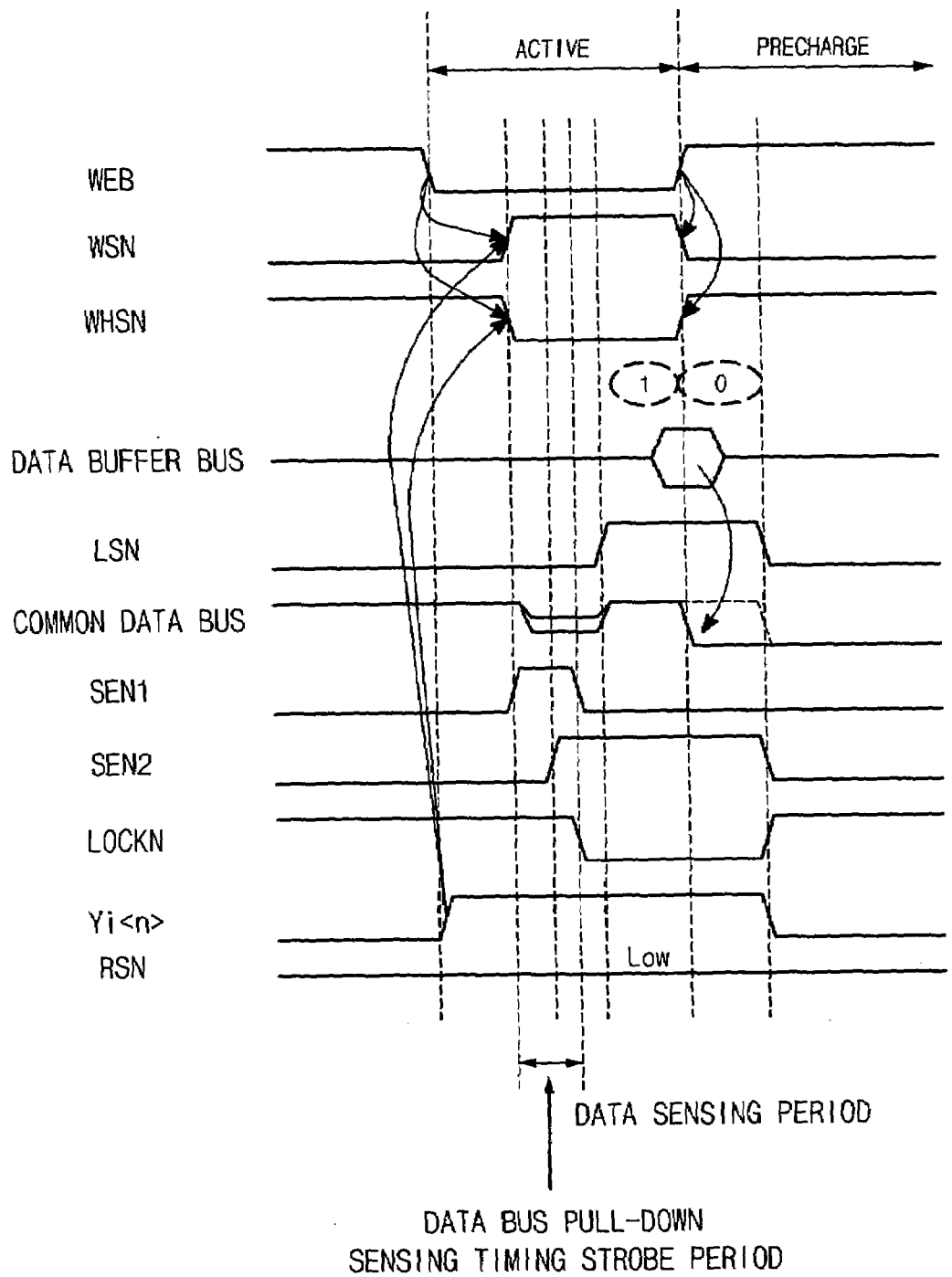
FIG. 15 is a timing diagram illustrating the operation of a column selected at a write mode in the sense amplifier array unit according to an embodiment of the present invention.

FIG. 15 is a timing diagram illustrating the operation of a column selected at a write mode in the sense amplifier array unit 300 according to an embodiment of the present invention.

As a write enable signal WEB is inactivated and a column selecting signal Yi<n> is activated, the write control signals WSN and WHSN becomes 'high' and 'low', respectively. Next, the sensing control signal SEN1 is activated in the data sensing period, and the sensing control signal SEN2 is activated while the sensing control signal SEN1 is activated. As a result, the sensed data are latched in the data latch unit 360. However, the latched sensing data are not transmitted to the common data bus 200 since the write control signal WHSN is inactivated.

If the sensing control signal SEN1 is inactivated after the sensing data are latched, the lock signal LOCKN is inactivated to intercept transmission of the sensed data to the data latch unit 360.

In the write mode, if the write data are applied to the data buffer bus 400, the corresponding data are latched in the data latch unit 360. Then, if the write control signal WHSN is activated, the latched data are transmitted to the node DO_2 of the data-out regulating unit 380. The data of the node DO_2 are transmitted to the common data bus 200 as the control signal LSN is activated to 'high'.

Figure 16:
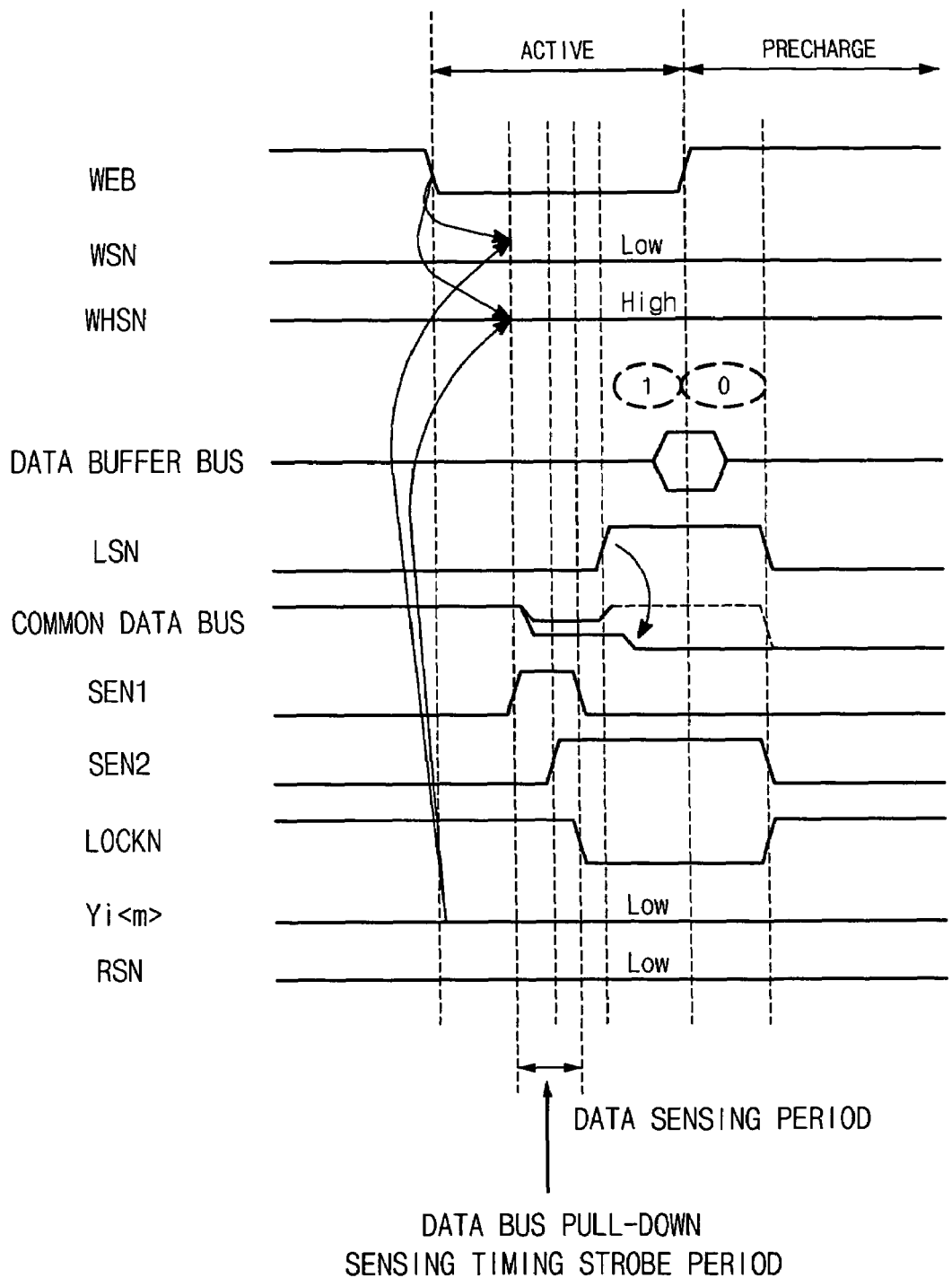
FIG. 16 is a timing diagram illustrating the operation of an unselected column at a write mode in a timing data register array unit according to an embodiment of the present invention.

FIG. 16 is a timing diagram illustrating the operation of an unselected column at a write mode in a timing data register array unit according to an embodiment of the present invention.

As a column selecting signal Yi<m> is not selected, the write control signal WSN is inactivated to 'low' so that the write data of the data buffer bus 400 are not transmitted to the data latch unit 360.

Thereafter, the data sensed in the sensing period are stored in the data latch unit 360, and transmitted to the common data bus 200. That is, unselected column data are operated in the restoration mode.

Figure 17:
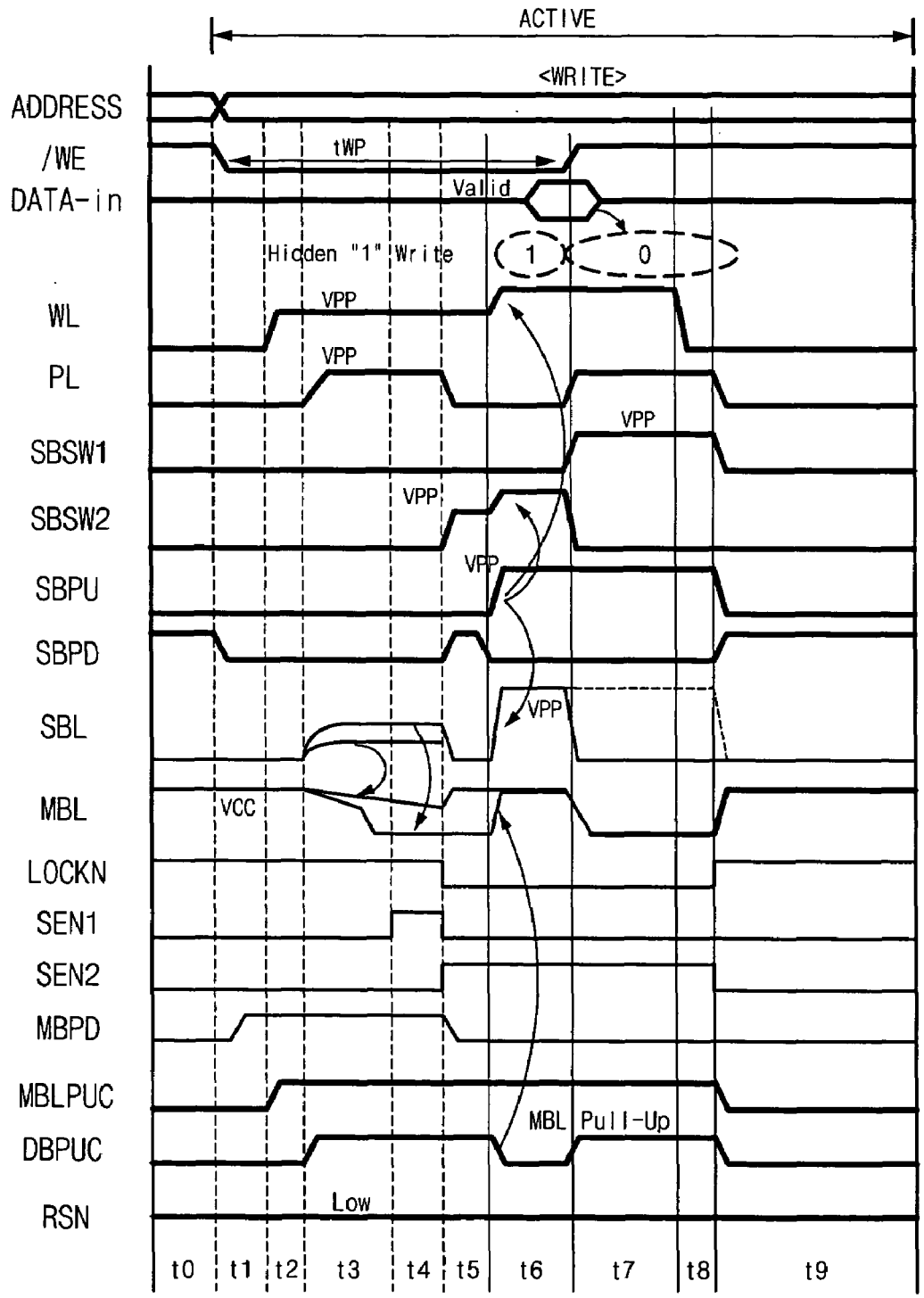
FIG. 17 is a timing diagram illustrating the write operation of the nonvolatile ferroelectric memory device according to an embodiment of the present invention.

FIG. 17 is a timing diagram illustrating the write operation of a nonvolatile ferroelectric memory device according to an embodiment of the present invention.

In an interval t0, if an address signal is transited and a write enable signal /WE is inactivated to 'low', the write mode becomes active.

Intervals t1 and t2 are pull-up periods. Before the word line WL and the plate line PL are activated, the voltages of the main bit line MBL and the common data bus 200 are pulled up to 'high' by the main bit line pull-up control signal MBLPUC and the data bus pull-up control signal DBPUC. In the interval t2, the word line WL is enabled and the sub bit line pull-down signal SBPD is disabled to 'low' so that the storage node of the cell is initialized to the ground level. Here, since the word line WL is activated earlier than the plate line PL for a predetermined time, the state of the cell storage node is stabilized at the initial operation, thereby improving the sensing margin.

Intervals t3 and t4 are sensing periods. In the interval t3, if the plate line PL is activated to a pumping voltage VPP level, cell data are transmitted to the sub bit line SBL. Then, the sensing voltage is induced to the main bit line MBL depending on the sensing voltage of the sub bit line SBL. If the data bus pull-up control signal DBPUC is activated to 'high', the bus pull-up unit 310 stops the pull-up operation of the common data bus 200. In the interval t4, if the sensing control signal SEN1 is activated to 'high', the sense amplifier unit 340 senses data of the common data bus 200. The sensed data are latched in the data latch unit 360 in response to the sensing control signal SEN2. Next, the sensing control signal SEN1 is inactivated to 'low' and the lock signals LOCKN/LOCKP are inactivated at the same time. In an interval t5, the data are stored in the data latch unit 360.

In the interval t5, the plate line PL is inactivated to 'low', and the sub bit line selecting signal SBSW2 is activated to the pumping voltage VPP level. Then, the sub bit line pull-down signal SBPD is activated to 'high', the voltage level of the sub it line SBL becomes at the ground level, and the main bit line MBL is activated to 'high'.

In an interval t6, if a high voltage is applied as the sub bit line pull-up signal SBPU and the sub bit line selecting signal SBSW2 is pumped, the high voltage is transmitted to the sub bit line SBL. Then, if the word line WL is pumped, high data (hidden "1") are written in all cells connected to the pumped word line WL regardless of the data to be written. Also, the sub bit line pull-down signal SBPD is inactivated to 'low'. The write data applied to the data buffer bus unit 400 are stored in the data latch unit 360. In the interval t6, when the voltage of the main bit line MBL is at the low level, the voltage is required to be pulled up to 'high'. Here, the main bit line MBL is pulled up by the bus pull-up unit 310 in response to the data bus pull-up control signal DBPUC.

When an interval t7 starts, the write enable signal /WE is activated to 'high', and the write control signal WHSN is activated so that the data stored in the data latch unit 360 are transmitted to the common data bus 200. The data of the common data bus 200 are transmitted through the column selecting switch unit 140 to the main bit line MBL. Then, the data of the main bit line MBL are transmitted to the sub bit line SBL as the sub bit line selecting signal SBSW1 is activated, and written in the cell. Here, if the data of the sub bit line SBL are 'high', the data (hidden "1") written in the interval t6 are maintained. However, if the data of the sub bit lien SBL are 'low', low data are written in the corresponding cell.

Figure 18:
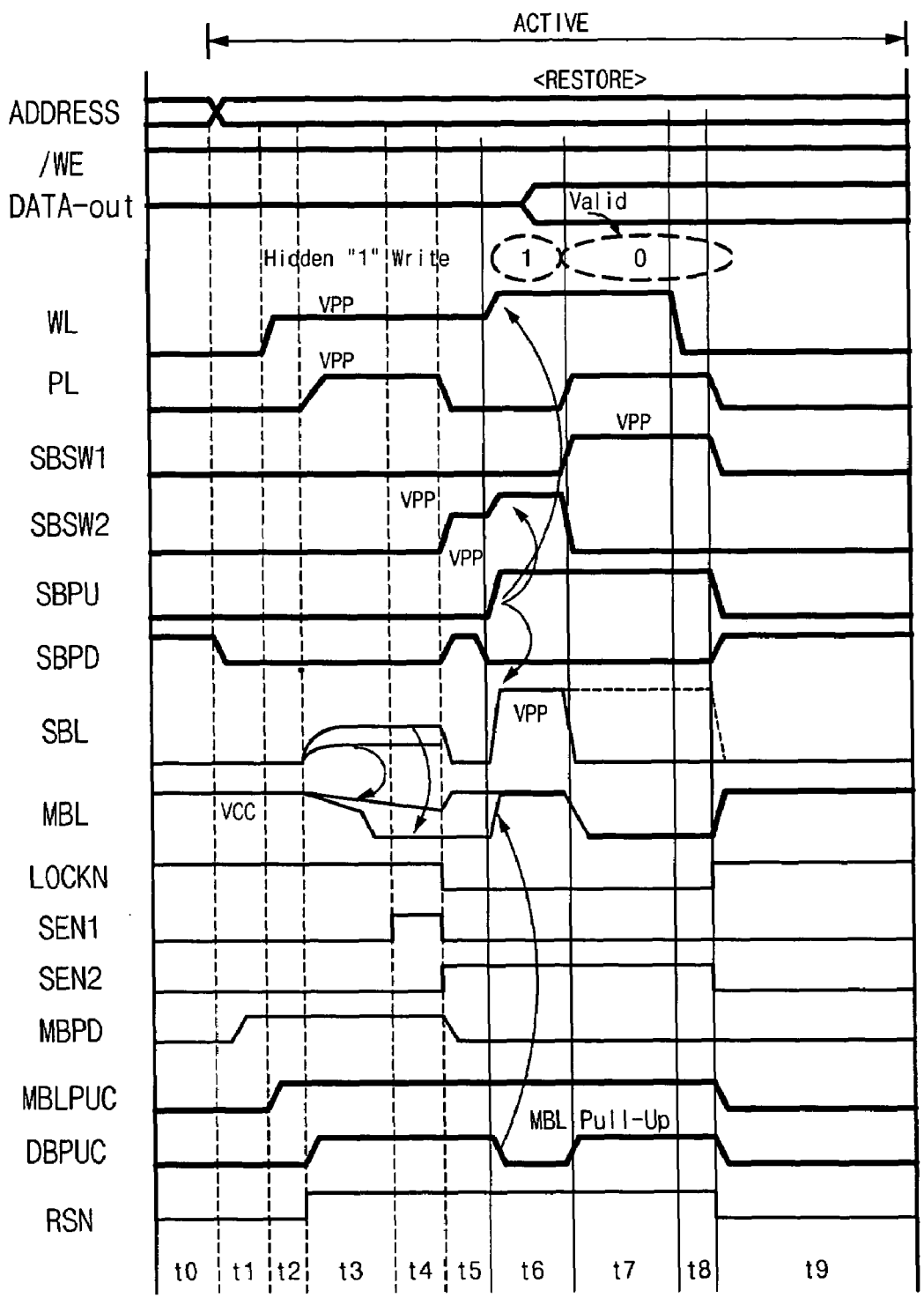
FIG. 18 is a timing diagram illustrating the read operation of the nonvolatile ferroelectric memory device according to an embodiment of the present invention.

FIG. 18 is a timing diagram illustrating the read operation of the nonvolatile ferroelectric memory device according to an embodiment of the present invention.

In the read mode, the write enable signal /WE is maintained at the power voltage level. After the interval t6, the data output effective period is maintained.

Here, if the write control signal WSN is maintained at the low level, the write data inputted through the data buffer bus 400 are not written in the cell but the read data stored in the data latch unit 360 are restored in the cell.

In intervals t3~t8, the read selecting signal RSN is activated, and the read data stored in the data latch unit 360 are transmitted to the data buffer bus 400.

As discussed earlier, a nonvolatile ferroelectric memory device having a data bus pull-down sensing function according to an embodiment-of the present invention senses data faster by previously pulling down a voltage of a common data bus, which is precharged to a high level, to a predetermined level which refers to a sensing threshold voltage before data are sensed.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A sense amplifier array having a data bus pull-down sensing function for sensing data outputted through a data bus from a cell array having a hierarchical bit line architecture including main bit lines and sub bit lines, the sense amplifier array comprising:
    a bus pull-up unit for pulling up the data bus in a precharge mode;
    a bus pull-down unit for pulling down a voltage of the pulled-up data bus to a predetermined level before data are sensed;
    a sense amplifier unit for sensing a voltage of the data bus depending on a previously set sensing detection threshold voltage;
    a lock switch unit for selectively transmitting data sensed in the sense amplifier unit in response to a lock signal;
    a data latch unit for storing data transmitted through the lock switch unit;
    a data-out regulating unit for transmitting data stored in the data latch unit to a data buffer for external output; and
    a write switch unit for selectively transmitting data of the data-out regulating unit to the data bus for data restoration.

2. The sense amplifier array according to claim 1, wherein the bus pull-down unit comprises:
    a pull-down regulating unit for activating a pull-down signal when a voltage of the data bus is higher than the predetermined level while a bus pull-down control signal is activated; and
    a pull-down level regulating unit for pulling down a voltage of the data bus to the predetermined level while the pull-down signal is activated.

3. The sense amplifier array according to claim 2, wherein the pull-down level regulating unit comprises:
    a first switch unit for activating the pull-down level regulating unit when the bus pull-down control signal is activated; and
    a second switch unit for regulating time required until the data bus is pulled down to the predetermined level in response to the pull-down signal when the pull-down level regulating unit is activated.

4. The sense amplifier array according to claim 3, wherein the second switch unit is connected between the data bus and the first switch unit, and at least one or more of switch devices connected in parallel and selectively turned on/off in response to the pull-down signal.

5. The sense amplifier array according to claim 3, wherein the second switch unit comprises:
    a third switch unit connected between the data bus and the first switch unit, and selectively turned on/off in response to the pull-down signal;
    at least one or more of fourth switch units selectively connected in parallel to the third switch unit, and selectively turned on/off in response to the pull-down signal; and
    a regulating switch unit corresponding one by one to the fourth switch units, and for selectively connecting the third switch unit to the fourth switch units in parallel.

6. A nonvolatile ferroelectric memory device having a data bus pull-down sensing function, comprising:
    a plurality of cell array blocks each comprising a cell array having a hierarchical bit line architecture and storing cell data;
    a common data bus shared by the plurality of cell array blocks, and for transmitting read data and write data; and
    a sense amplifier array unit connected to the common data bus, and for sensing the read data transmitted from the common data bus and transmitting the write data to the common data bus,
    wherein the sense amplifier array unit pulls down a voltage of the common data bus to a predetermined level before the read data are sensed.

7. The nonvolatile ferroelectric memory device according to claim 6, wherein the sense amplifier array unit comprises:
    a bus pull-up unit for pulling up the common data bus in a precharge mode;
    a bus pull-down unit for pulling down a voltage of the pulled-up common data bus to a predetermined level before the read data are sensed;
    a sense amplifier unit for sensing a voltage of the data bus depending on a previously set sensing detection threshold voltage;

a lock switch unit for selectively transmitting data sensed in the sense amplifier unit in response to a lock signal;

a data latch unit for storing data transmitted through the lock switch unit;

a data-in regulating unit for transmitting the write data received from a data buffer to the data latch unit in a write mode;

a data-out regulating unit for transmitting data stored in the data latch unit to the common data bus or the common data bus and the data buffer depending on the operation mode; and a write switch unit for transmitting data of the data-out regulating unit to the common data bus for data restoration.

8. The nonvolatile ferroelectric memory device according to claim 7, wherein the bus pull-down unit comprises:

a pull-down regulating unit for activating a pull-down signal when a voltage of the data bus is higher than the predetermined level while a bus pull-down control signal is activated; and a pull-down level regulating unit for pulling down a voltage of the data bus to the predetermined level while the pull-down signal is activated.

9. The nonvolatile ferroelectric memory device according to claim 8, wherein the pull-down level regulating unit comprises:

a first switch unit for activating the pull-down level regulating unit when the bus pull-down control signal is activated; and a second switch unit for regulating time required until the data bus is pulled down to the predetermined level in response to the pull-down signal when the pull-down level regulating unit is activated.

10. The nonvolatile ferroelectric memory device according to claim 9, wherein the second switch unit is connected between the data bus and the first switch unit, and comprises at least one or more of switch devices connected in parallel and selectively turned on/off in response to the pull-down signal.

11. The nonvolatile ferroelectric memory device according to claim 9, wherein the second switch unit comprises:

a third switch unit connected between the common data bus and the first switch unit, and selectively turned on/off in response to the pull-down signal;

at least one or more of fourth switch units selectively connected in parallel to the third switch unit, and selectively turned on/off in response to the pull-down signal; and a regulating switch unit corresponding one by one to the fourth switch units, and for selectively connecting the third switch unit to the fourth switch units in parallel.

12. A data sensing method using a data bus pull-down function in a memory device comprising a plurality of cell array blocks each comprising cell arrays having a hierarchical bit line architecture and a common data bus shared by the cell array blocks, the method comprising the steps of:

pulling up the main bit line and the common data bus in a precharge mode;

pulling down the pulled-up common data bus to a predetermined level before data are sensed; and inducing voltage change of the common data bus by a sensing voltage induced to the main bit line while the common data bus is pulled down to the predetermined level, and sensing the voltage change of the common data bus by using a previously set sensing detection threshold voltage.

13. The method according to claim 12, wherein the predetermined level is the sensing detection threshold voltage.

* * * * *